(12) United States Patent
Jones et al.

(10) Patent No.: US 6,295,015 B1
(45) Date of Patent: Sep. 25, 2001

(54) REFERENCE GENERATOR FOR DEMODULATOR CALIBRATION

(75) Inventors: Gary A. Jones, Hawthorn Woods; Gary J. Sgrignoli, Mt. Prospect; Minglu Zhang, Mundelein, all of IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/388,327

(22) Filed: Sep. 1, 1999

(51) Int. Cl.[7] .................................................. H03M 3/00
(52) U.S. Cl. .......................... 341/143; 341/152; 341/131; 341/142; 341/147; 341/166; 341/150; 341/155; 341/126; 341/118; 329/319; 329/345; 329/318; 329/351; 375/230; 375/12; 375/224; 375/316
(58) Field of Search ...................................... 341/143, 147, 341/152, 131, 166, 126, 142, 155, 144, 118, 150; 375/224, 230, 316; 329/319, 318, 345

(56) References Cited

U.S. PATENT DOCUMENTS

| | | | |
|---|---|---|---|
| 5,481,564 | * | 1/1996 | Kakuiishi et al. .................... 375/230 |
| 5,495,504 | * | 2/1996 | Yasuda ................................. 375/281 |
| 5,614,903 | * | 3/1997 | Oyama ................................. 341/118 |
| 5,859,605 | * | 1/1999 | Raghavan et al. .................... 341/143 |
| 6,166,594 | * | 12/2000 | Nielsen et al. ....................... 326/319 |

* cited by examiner

Primary Examiner—Michael Tokar
Assistant Examiner—Lam T Mai

(57) ABSTRACT

A reference generator includes a memory that stores reference data which, when clocked out of the memory, produces an ATSC compliant VSB reference signal substantially free of sub-harmonics of the clock signal. A digital-to-analog converter converts the clocked out reference data to an analog signal. The analog signal may be at low IF. An up converter is arranged to upconvert the output of the digital-to-analog converter to an RF reference signal. The RF reference signal can be used, for example, to calibrate a VSB demodulator.

37 Claims, 1 Drawing Sheet

REFERENCE GENERATOR FOR DEMODULATOR CALIBRATION

RELATED APPLICATION

The present application is related to U.S. patent application Ser. No. 09/388,047 filed Sep. 1, 1999.

TECHNICAL FIELD OF THE INVENTION

The present invention relates to a reference generator for generating a substantially distortion free ATSC (Advanced Television Systems Committee) compliant VSB (vestigial sideband) reference signal which may be used, for example, to calibrate a digital demodulator.

BACKGROUND OF THE INVENTION

Demodulators are used in television applications in order to demodulate the intermediate frequency (IF) output of a tuner down to baseband for further processing by a receiver. Professional demodulators are special examples of demodulators that are typically used in a laboratory or on a production line in order to test modulators, transmitters, and translators. However, professional demodulators have other uses such as monitoring broadcasts or cable transmissions, testing receivers, field testing television transmissions, and as exhibits used in demonstrations and seminars. In such cases, the professional demodulator receives an input signal to be monitored and provides various outputs representing the input signal which is received over a channel.

When testing transmission equipment, for example, there are generally two sources of distortion in the output of a professional demodulator. One source of distortion is the transmission equipment itself. The professional demodulator is typically provided with distortion correcting components, such as equalizers, in order to reduce distortion caused by the transmission equipment being tested.

The other source of distortion is the professional demodulator itself. This type of distortion is generally caused by variations in component performance characteristics and by component performance characteristics which change over time. For example, the tuner of a professional demodulator contributes to such demodulator caused distortion. In the case of tuner caused distortion, not only does the performance characteristics of the tuner change over time, but the performance characteristics of the tuner also change from channel to channel.

It is standard practice to calibrate a professional demodulator in the factory in order to reduce demodulator caused distortion. However, such calibration, although satisfactory at the time the professional demodulator leaves the factory, can soon become unsatisfactory because of the time related changes of the demodulator's performance characteristics.

Moreover, calibrating the professional demodulator in the factory poses the additional problem of determining the channel to which the professional demodulator should be calibrated. That is, a professional demodulator that is optimally calibrated in the factory at one channel is not optimally calibrated at another channel because, as discussed above, the performance characteristics of the demodulator's tuner change from channel to channel. Thus, a professional demodulator that is optimally calibrated in the factory at one channel may not be optimally calibrated when being used to test equipment operating at a different channel.

The present invention is directed to a reference generator which may be used to supply a substantially distortion free ATSC compliant VSB reference signal to a digital demodulator so that the digital demodulator can be calibrated in the field. However, it should be understood that the reference generator of the present invention may be used for purposes other than calibrating a digital demodulator.

SUMMARY OF THE INVENTION

In accordance with one aspect of the present invention, a reference generator for generating an ATSC compliant VSB reference signal comprises a memory, a digital-to-analog converter, a clock, and a low-pass reconstruction filter. The memory stores reference data representing a modulated ATSC compliant VSB signal having substantially no distortion. The clock emits a clock signal that clocks the stored reference data out of the memory to the digital-to-analog converter to produce a continuous converter output. The low-pass reconstruction filter filters the converter output.

In accordance with another aspect of the present invention, a computer readable storage medium has a block of reference data stored thereon. The block of reference data, when repeatedly clocked out of the computer readable storage medium by a clock signal, functions as a continuous ATSC compliant VSB reference signal producing substantially no sub-harmonics of the clock signal.

In accordance with a further aspect of the present invention, a method of preparing ATSC compliant VSB reference data for storage in a memory comprises the following steps: a) modulating data with a carrier so that the data is modulated using an integral number of carrier cycles, wherein the modulated data has ATSC synchronization and DC bias; and, b) pre-distorting the modulated data in order to compensate for distortion imposed on the modulated data during a digital-to-analog conversion.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 1:
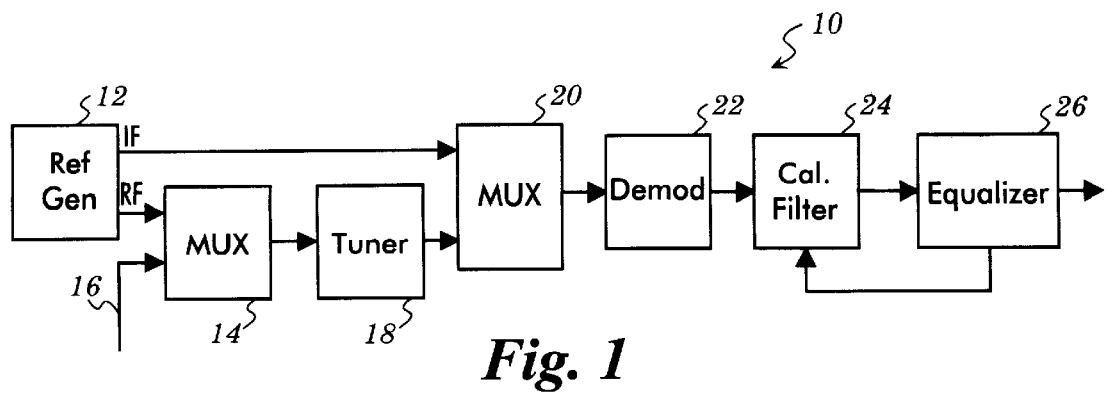
FIG. 1 is a block diagram of a self calibrating system having a reference generator arranged to generate a substantially distortion free ATSC compliant VSB reference signal.

A self calibrating demodulator system 10 is shown in FIG. 1 and includes a reference generator 12 which generates a substantially distortion free ATSC compliant VSB reference signal either at RE or IF. The substantially distortion free ATSC compliant VSB reference signal at RF is supplied to a multiplexer 14 which selectively switches either the substantially distortion free ATSC compliant VSB reference signal at RF or an external RF channel signal on an input 16 to a tuner 18. The external RF channel signal may be provided, for example, by equipment to be tested. The tuner 18 tunes to either the substantially distortion free ATSC compliant VSB reference signal or the external channel signal as selected by the multiplexer 14 and provides a tuner output signal at IF to a multiplexer 20. The multiplexer 20 switches either the output of the tuner 18 or the substantially distortion free ATSC compliant VSB reference signal at IF from the reference generator 12 to a demodulator 22 which demodulates the output from the multiplexer 20 down to baseband.

Because the output of the demodulator 22 is an ATSC compliant VSB baseband signal, a decoder (not shown) may be provided downstream of the demodulator 22 in order to perform data de-interleaving, trellis decoding for VSB mode 8T, Reed-Solomon forward error correction decoding, and data de-randomization.

During self calibration, the substantially distortion free ATSC compliant VSB reference signal from the reference generator 12 is connected by the multiplexer 14 to the tuner 18, and the multiplexer 20 connects the tuned reference signal to the demodulator 22. The demodulator 22 demodulates the tuned reference signal down to baseband, and the baseband signal from the demodulator 22 is processed by a calibrator filter 24 and an equalizer 26.

The calibration filter 24, for example, may be a linear tapped delay line variable filter having 64 taps and being capable of correcting demodulator caused distortions such as, for example, demodulator caused linear distortions. The equalizer 26, for example, may comprise a pre-calibration section having 64 feedforward taps, a post-calibration section having 192 feedback taps, and a summer. The output of the calibration filter is supplied to the pre-calibration section of the equalizer 26, the output of the pre-calibration section of the equalizer 26 is supplied to a first input of the summer, and the output of the summer is fed to the equalizer 26 and also is fed back through the post-calibration section to a second input of the summer. The equalizer 26, for example, optimizes the data eyes of any received distorted signals If desired, a phase tracker (not shown) may follow the equalizer 26 in order to remove phase noise.

During self calibration, the demodulator 22 is provided with the reference signal from the reference generator 12. The reference signal may be provided at any selected one of a number of RF channels. The reference signal is demodulated by the demodulator 22. The calibration filter 24 is initially set so that it does not filter the demodulated reference signal. Accordingly, the demodulated reference signal passes substantially unchanged through the calibration filter 24 to the equalizer 26. The equalizer 26 adjusts in order to reduce demodulator caused distortion in the reference signal. Such demodulator caused distortion includes any frequency and/or phase distortion introduced into the reference signal by the demodulator 22 and/or by any other equipment of the self calibrating demodulator system 10 which is upstream of the calibration filter 24. When the output of the equalizer 26 is a demodulated version of the substantially distortion free ATSC compliant VSB reference signal provided by the reference generator 12 (within some tolerance), the 64 pre-calibration tap values of the equalizer 26 are used to reconfigure the calibration filter 24 so that the calibration filter 24 removes any demodulator caused distortion from the external source signal supplied to the demodulator 22 over the input 16.

After self calibration, an RF channel signal from an external source, such as transmission or other equipment being tested, may then be provided over the input 16 to the demodulator 22 which demodulates this external source signal. The reconfigured calibration filter 24 removes demodulator caused distortion from the demodulated external source signal, and the equalizer 26 removes transmission equipment and/or channel caused distortion from the demodulated external source signal. The equalizer 26, therefore, produces a substantially accurate indication of the performance of the equipment being tested.

Figure 2:
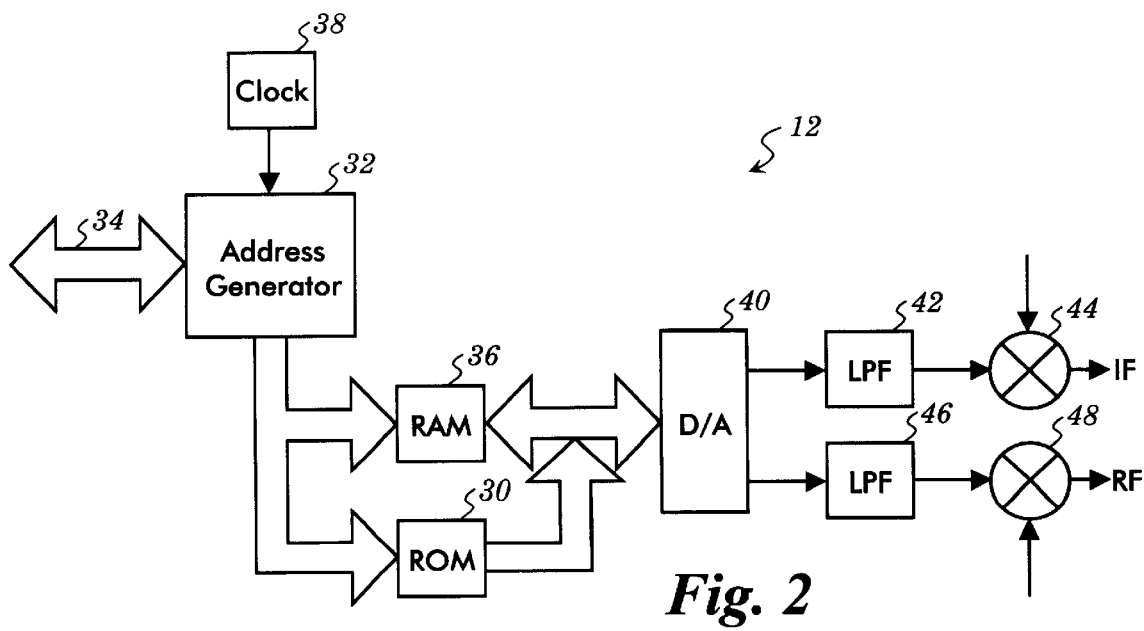
FIG. 2 illustrates the reference generator of FIG. 1 in more detail.

FIG. 2 illustrates the reference generator 12 in additional detail. A ROM 30 stores substantially distortion free ATSC compliant VSB reference data which is used to generate the substantially distortion free ATSC compliant VSB reference signals at IF and RF. Because the reference data stored in the ROM 30 are ATSC compliant VSB reference data, the reference data stored in the ROM 30 are provided with all of the syncs and DC bias of a normal ATSC compliant VSB signal. The data of the substantially distortion free ATSC compliant VSB reference data, other than the syncs, may be any data, provided that such data has the modulation levels and filtering of the type that is used in the transmission of digital broadcast signals. However, the substantially distortion free ATSC compliant reference data may also include the randomization, Reed-Solomon forward error correction, trellis encoding in the case of the mode 8T, and interleaving used in the transmission of digital television signals so that the substantially distortion free ATSC compliant reference data may be used for verification of digital broadcast signal decoding equipment. Moreover, if desired, the substantially distortion free ATSC compliant VSB reference data stored in the ROM 30 may optionally use floating point accuracy.

Because the VSB equipment to be tested can operate in any one of a number of different VSB modes, the ROM 30 must store reference data for each of these modes. As is known, "mode" refers to the number of modulation levels that are used to transmit bits of information in an ATSC compliant VSB signal. Thus, if mode=2, two modulation levels are used to transmit one bit of non-trellis encoded data; if mode=4, four modulation levels are used to transmit two bits of non-trellis encoded data; if mode=8, eight modulation levels are used to transmit three bits of non-trellis encoded data; if mode=8T, eight modulation levels are used to transmit two bits of trellis encoded data; and, if mode=16, sixteen modulation levels are used to transmit four bits of non-trellis encoded data.

Accordingly, the ROM 30 must store reference data for each of these modes. In the case where the VSB mode=2, 4, 8, or 16, the ROM 30 preferably stores two fields of reference data per mode, and in the case where the VSB mode is 8T, the ROM 30 preferably stores four fields of data. Each field of data includes 313 segments having 832 symbols per segment. Thus, one field of data for mode=2, 4, 8, 8T, and 16 contains 260,416 symbols. Because the ROM 30 preferably stores two fields of data for each of the modes 2, 4, 8, and 16, a block of data stored in the ROM 30 for each of these modes contains 520,832 symbols. Because the ROM 30 preferably stores four fields of data for the mode 8T, a block of data stored in the ROM 30 for this mode contains 1,041,664 symbols.

The data stored in the ROM 30 is prepared as follows. Raw digital data is provided in MPEG packet form. This data includes, in the following order, a 47 Hex sync, sufficient up-counts beginning with 0 to produce 188 bytes of data symbols (where the up-counts are produced by counting up from 0 by ones for 188 bytes), a 47 Hex sync, and sufficient down-counts beginning with FF Hex so as to produce another 188 bytes of data symbols (where the down-counts are produced by counting down by ones). This process is repeated in order to fill four fields for mode 8T and two fields for each of the modes 2, 4, 8, and 16.

The 47 Hex syncs are stripped off and are replaced by the segment syncs of an ATSC compliant VSB signal. Accordingly, 520,832 symbols per block are produced for each of the modes 2, 4, 8, and 16, and 1,041,664 symbols are produced for the mode 8T block. The resulting data represent fully functional ATSC compliant VSB baseband data. In order to use the reference data for verifying digital broadcast signal decoding equipment, the data may also be randomized, Reed-Solomon forward error encoded, trellis encoded in the case of mode=8T, and interleaved. Also, a DC bias is added to these data.

Zero insertion is performed on this baseband data such that the clock which clocks the data out to the tuner 18 and/or the demodulator 22 must operate at twice the symbol clock $f_{sym}$. Zero insertion is performed by inserting a zero after each of the fully functional ATSC compliant VSB baseband data. As a result of zero insertion, there are 1,041,664 data symbols per block for each of the modes 2, 4, 8, and 16, and 2,083,328 data symbols for the block of mode 8T data. Because of zero insertion, a clock operating at about 21.52 MHZ is required in order to clock data out of the RAM 36.

Following zero insertion, the data for each mode are modulated with (multiplied by) a complex sinusoidal pilot carrier. Care must be taken in choosing the frequency for the pilot carrier in order to avoid producing sub-harmonics of the clock signal that clocks the reference data out of the RAM 36. The exact pilot frequency $f_P$ relative to the center of the ATSC compliant VSB system bandpass is determined according to the following equation:

$$f_P = \frac{f_{sym}}{4} + 4 \times 10^6 = 6.690559441 \text{ MHZ} \quad (1)$$

where $f_{sym}$ is given by the following equation:

$$f_{sym} = \frac{684}{286} \cdot 4.5 \times 10^6 = 10.762237 \text{ MHZ}. \quad (2)$$

Figure 3:
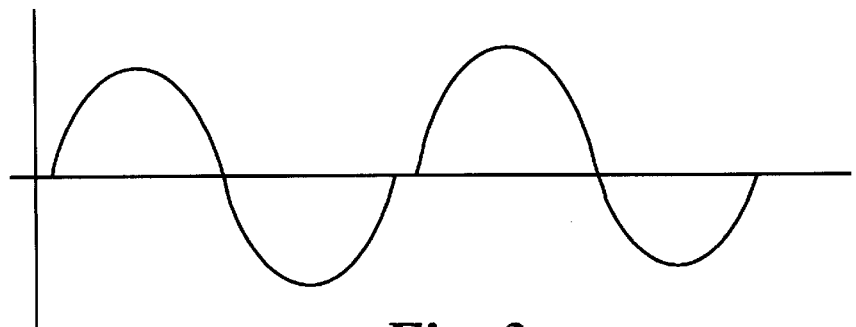
FIG. 3 is a diagram useful in illustrating a discontinuity that could result when reference data is not properly modulated.

However, the pilot frequency $f_P$ given by equation (1) does not produce an integral number of cycles to accommodate the N data symbols of a data block (520,832 data symbols per block for VSB mode=2, 4, 8, and 16, and 1,041,664 data symbols for the VSB mode=8T data block). Accordingly, because the N data symbols do not fit in an integral number carrier cycles of the pilot, a discontinuity such as that shown in FIG. 3 may be produced that will result in the generation of sub-harmonics.

The number of carrier cycles required to modulate the N data symbols, where N=1,041,664 and where the pilot frequency is given by equation (1), is calculated in the following equation:

$$C = f_P NT = 323785.5854 \quad (3)$$

where T is the inverse of twice the symbol clock $f_{sym}$ given by equation (2). As can be seen, C is not an integral number. However, if C is rounded up to 323786, the pilot frequency $f_P$ may re-calculated using equation (3) as 6.690568007 MHZ. (C could instead be rounded down, but rounding down produces a somewhat larger error than rounding up.) This frequency, therefore, produces an integral number of cycles for each of the data blocks stored in the RAM 36.

During modulation, each datum and zero derived as discussed above is multiplied by $\sin(\Phi)$, where $\Phi$ is continually incremented by the phase advance produced by a pilot having the frequency of 6.690568007 MHZ. The phase advance for all modes of data is determined in accordance with the following equation:

$$\text{phase advance} = \frac{360° \cdot C}{N} = 111.9007281° \quad (4)$$

Accordingly, the first datum is multiplied by sin(0), the second datum is multiplied by sin(111.9007281), the third datum is multiplied by sin(223.8014562), and so on during the rest of the modulation.

The modulation of data (including the inserted zeroes) results in a low IF ATSC compliant VSB spectrum centered at about 4 MHZ with the pilot at about 6.691 MHZ.

The modulated data are then interpolated by a digital reconstruction filter in order to smooth the data. The reconstruction filter includes a complex 1/sinx/x filter (i.e., an inverse sinx/x filter) and a complex root-raised cosine bandpass filter compliant with the ATSC standard. This filtering pre-distorts the data so as to compensate for the distortion imposed on the data during the digital-to-analog conversion process discussed below, and removes the upper sideband of the double sideband modulated data leaving the lower sideband centered at about 4 MHZ, which is low IF. Optionally, the data may also be filtered in order to compensate for the imperfections imposed on the data by the low pass reconstruction filtering discussed below. Each data point is then normalized and stored in the ROM 30. This process is repeated for each of the modes. Prior to storing the data in the ROM 30, the data may be rounded to, for example, twelve bits.

Alternatively, following zero insertion, the data for each mode may be processed entirely in the real domain by initially filtering the data with a low pass filter having an appropriate bandwidth (such as 0–5.69 MHZ) and then multiplying the result by a real sinusoidal pilot carrier followed by band pass filtering with a real inverse sinx/x filter and a real root-raised cosine bandpass filter compliant with the ATSC standard (which removes the upper sideband of the double sideband modulated data).

As shown in FIG. 2, an address generator 32 is controlled by a controller (not shown) over a control line 34 in order to address the ROM 30 so as to transfer a stored data block corresponding to a selected mode from the ROM 30 to a RAM 36 under control of a clock 38 operating at about 5.38 MHZ. By using the RAM 36, which may be operated at 21.52 MHZ, a lower speed ROM may be used for the ROM 30. Also under control of the address generator 32, the data block corresponding to the selected mode is then repeatedly clocked out of the RAM 36 to a digital-to-analog convertor 40 which converts the digital data in the data block to an analog signal. The analog signal is processed along two paths.

Along one path, the data, having a center frequency of about 4 MHZ, is low-passed filtered by a low-pass reconstruction filter 42. The low-pass reconstruction filter 42 may have a cutoff at 12.9 MHZ and is arranged to eliminate images of the clocked out data from the output of the digital-to-analog convertor 40. These images are centered at about 21.52 MHZ and are above the 12.9 MHZ point. A mixer 44 mixes the analog data from the low-pass reconstruction filter 42 with a 40 MHZ signal in order to produce the IF reference signal having a center frequency at about 44 MHZ. The IF reference signal is supplied directly to the multiplexer 20 of FIG. 1.

Along another path, the data, having the center frequency of about 4 MHZ, is low-passed filtered by a low-pass reconstruction filter 46. As in the case of the low-pass reconstruction filter 42, the low-pass reconstruction filter 46 may have a cutoff at 12.9 MHZ. A mixer 48 mixes the analog data from the low-pass reconstruction filter 46 with a signal having a frequency that is selected so that the output of the mixer 48 is at a selected RF channel frequency. The substantially distortion free ATSC compliant VSB reference signal at the output of the mixer 48 is supplied to the multiplexer 14 of FIG. 1.

Accordingly, the mixer 44 upconverts the output of the digital-to-analog convertor 40 from low IF to IF at 44 MHZ, and the mixer 48 upconverts the output of the digital-to-analog convertor 40 from low IF to a selected RF channel.

A data block is repeatedly clocked out of the RAM 36 from n=0 to n=N−1. Because the N data of a data block has been modulated using an integral number of cycles of pilot carrier, the clocked out data has no discontinuities and is continuous so that substantially no sub-harmonics of the clock are produced.

Certain modifications of the present invention will occur to those practicing in the art of the present invention. For example, as described above, the reference data stored in the RAM 36 are clocked out from n=0 to n=N−1. Instead, the reference data could be clocked out from any other addresses.

Moreover, the present invention has been described above in connection with the generation of a substantially distortion free ATSC compliant VSB reference signal. However, the present invention may instead be used to generate a substantially distortion free QAM reference signal that can be used to calibrate a digital demodulator. In this case, the data that is stored in the ROM 30 should preferably contain valid QAM levels, QAM modulation, and QAM filtering.

Furthermore, a high speed ROM may be used in place of the low speed ROM 30 and the high speed RAM 36.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A reference generator for generating a digital broadcast reference signal comprising:
   a memory storing reference data representing a modulated digital broadcast signal having substantially no distortion, wherein the reference data are modulated with a pilot carrier producing an integral of cycles within which to modulate the reference data;
   a digital-to-analog converter;
   a clock emitting a clock signal that clocks the stored reference data out of the memory to the digital-to-analog converter to produce a continuous converter output; and,
   a low-pass reconstruction filter arranged to filter the converter output.

2. The reference generator of claim 1 wherein the stored reference data include segment syncs.

3. The reference generator of claim 2 wherein the reference data include a series of up and down counts, wherein the up counts start at zero and are increased by one to a number sufficient to produce 188 bytes, and wherein the down counts are decreased therefrom by one to zero.

4. The reference generator of claim 3 wherein the up and down counts represent baseband data sampled at about 10.76 MHZ.

5. The reference generator of claim 4 wherein zero insertion is performed on the up and down counts so that the reference data correspond to baseband data effectively sampled at about 21.52 MHZ.

6. The reference generator of claim 5 wherein the reference data are pre-distorted to compensate for distortion caused by the digital-to-analog converter.

7. The reference generator of claim 6 wherein the reference data are modulated with a pilot carrier producing an integral of cycles within which to modulate the reference data.

8. The reference generator of claim 7 wherein the reference data are root raised cosine filtered.

9. The reference generator of claim 7 wherein the reference data are single sideband filtered in order to eliminate a sideband resulting from the modulation.

10. The reference generator of claim 1 wherein the reference data includes zero insertion so that the reference data correspond to baseband data effectively sampled at about 21.52 MHZ.

11. The reference generator of claim 10 wherein the reference data are modulated with a pilot carrier producing an integral of cycles within which to modulate the reference data.

12. The reference generator of claim 11 wherein the modulated reference data are pre-distorted to compensate for distortion caused by the digital-to-analog converter.

13. The reference generator of claim 12 wherein the modulated reference data are root raised cosine filtered.

14. The reference generator of claim 12 wherein the modulated reference data are single sideband filtered in order to eliminate a sideband resulting from the modulation.

15. The reference generator of claim 14 wherein the modulated reference data are root raised cosine filtered.

16. The reference generator of claim 14 wherein the pilot carrier is a complex pilot carrier, and wherein the modulated reference data are complex root raised cosine filtered.

17. The reference generator of claim 14 wherein the modulated reference data are single sideband filtered in order to eliminate a sideband resulting from the modulation.

18. The reference generator of claim 1 wherein the reference data are root raised cosine filtered.

19. The reference generator of claim 1 wherein the reference data are complex root raised cosine filtered.

20. The reference generator of claim 1 wherein the reference data are clocked out by the clock so that the clocked signal samples are at a low IF.

21. The reference generator of claim 1 wherein the reference data are pre-distorted to compensate for distortion caused by the digital-to-analog converter.

22. The reference generator of claim 1 wherein the reference data include compensation for distortion caused by the low pass reconstruction filter.

23. The reference generator of claim 1 wherein the reference data are a block of data comprising at least two fields of 313 segments per field.

24. The reference generator of claim 1 wherein the reference data include reference data for each of at least two VSB modes.

25. A computer readable storage medium having a block of reference data stored thereon, wherein the block of reference data, when repeatedly clocked out of the computer readable storage medium by a clock signal, functions as a continuous digital broadcast reference signal producing substantially no sub-harmonics of the clock signal.

26. The computer readable storage medium of claim 25 wherein the block of reference data, when repeatedly clocked out of the computer readable storage medium, functions as a continuous digital broadcast reference signal having ATSC frame and segment synchronization.

27. The computer readable storage medium of claim 25 wherein the block of reference data corresponds to at least one VSB mode.

28. The computer readable storage medium of claim 25 wherein the block of reference data is a first block of reference data, wherein the computer readable storage medium further stores a second block of reference data, and wherein the first and second blocks of reference data correspond to different VSB modes.

29. The computer readable storage medium of claim 25 wherein the block of reference data is created by modulating test data with a carrier having a frequency so that all reference data in the block of reference data are modulated using an integral number of carrier cycles.

30. The computer readable storage medium of claim 25 wherein the reference data in the block of reference data is pre-distorted so as to compensate for the distortion imposed on the data during an digital-to-analog conversion.

31. The computer readable storage medium of claim 25 wherein the reference data in the block of reference data is root raised cosine filtering the modulated data.

32. The computer readable storage medium of claim 25 wherein the reference data in the block of reference data is complex root raised cosine filtering the modulated data.

33. A method of preparing digital broadcast reference data for storage in a memory comprising the following steps:
   a) modulating data with a carrier so that the data is modulated using an integral number of carrier cycles, wherein the modulated data has ATSC synchronization and DC bias; and,
   b) pre-distorting the modulated data in order to compensate for distortion imposed on the modulated data during a digital-to-analog conversion.

34. The method of claim 33 further comprising the step of filtering the modulated data in order to remove a sideband caused by the modulation step.

35. The method of claim 33 further comprising the step of root raised cosine filtering the modulated data.

36. The method of claim 33 further comprising the step of complex root raised cosine filtering the modulated data.

37. The method of claim 33 wherein step a) results in the creation of two fields of digital broadcast reference data per VSB mode.

* * * * *